United States Patent
Fang

(10) Patent No.: US 10,771,191 B2
(45) Date of Patent: Sep. 8, 2020

(54) SYSTEM FOR HIGHLY RELIABLE FILE DELIVERY OF USING CONTINUOUS FEC ENCODING/DECODING

(71) Applicant: KenCast Inc., Norwalk, CT (US)

(72) Inventor: Weimin Fang, Stamford, CT (US)

(73) Assignee: KenCast, Inc., Norwalk, CT (US)

( * ) Notice: Subject to any disclaimer, the term of this patent is extended or adjusted under 35 U.S.C. 154(b) by 0 days.

(21) Appl. No.: 16/294,179

(22) Filed: Mar. 6, 2019

(65) Prior Publication Data
US 2019/0280808 A1    Sep. 12, 2019

Related U.S. Application Data

(60) Provisional application No. 62/640,801, filed on Mar. 9, 2018.

(51) Int. Cl.
*H04L 1/00* (2006.01)
*H03M 13/00* (2006.01)
*H03M 13/11* (2006.01)

(52) U.S. Cl.
CPC ....... *H04L 1/0041* (2013.01); *H03M 13/1102* (2013.01); *H03M 13/616* (2013.01); *H04L 1/0045* (2013.01)

(58) Field of Classification Search
None
See application file for complete search history.

(56) References Cited

U.S. PATENT DOCUMENTS

| | | |
|---|---|---|
| 4,718,066 A | 1/1988 | Rogard |
| 5,485,474 A | 1/1996 | Rabin |
| 5,594,490 A | 1/1997 | Dawson et al. |
| 5,600,663 A | 2/1997 | Ayanoglu et al. |
| 5,631,907 A | 5/1997 | Guarneri et al. |
| 6,012,159 A | 1/2000 | Fischer et al. |
| 6,272,658 B1 | 8/2001 | Steele et al. |

(Continued)

OTHER PUBLICATIONS

Luby et al., "Improved Low-Density Parity-Check Codes Using Irregular Graphs," IEEE Transaction on Information Theory, vol. 47, No. 2, Feb. 2001, p. 585-598.

(Continued)

*Primary Examiner* — Steve N Nguyen
(74) *Attorney, Agent, or Firm* — Ohlandt, Greeley, Ruggiero & Perle, L.L.P.

(57) ABSTRACT

For correction coding of a source file for transmission, the source file is divided into a plurality of groups each having a plurality of source packets. Each group is arranged into a matrix format, and braided forward error correction (FEC) packets are generated for each column, row and diagonal of a respective group by XOR'ing the source packets from the corresponding column, row and diagonal. Then, low density parity check (LDPC) FEC packets are generated for the respective group of source packets and corresponding braided FEC packets. The FEC packets generated in this manner, which are referred to as continuous FEC packets, are transmitted to a receiver component, and upon reception, an iteration of braided FEC decoding and LDPC FEC decoding is applied to the received continuous FEC packets, until all the source packets are recovered and the source file is reconstructed or until there is no more incoming packets.

12 Claims, 4 Drawing Sheets

(56) References Cited

U.S. PATENT DOCUMENTS

| | | | |
|---|---|---|---|
| 6,289,054 B1 | 9/2001 | Rhee | |
| 6,307,487 B1 | 10/2001 | Luby | |
| 6,317,462 B1 | 11/2001 | Boyce | |
| 6,320,520 B1 | 11/2001 | Luby | |
| 6,370,666 B1 | 4/2002 | Lou et al. | |
| 6,411,223 B1 | 6/2002 | Haken et al. | |
| 6,434,191 B1 | 8/2002 | Agrawal et al. | |
| 6,445,717 B1 | 9/2002 | Gibson et al. | |
| 6,463,080 B1 | 10/2002 | Wildey | |
| 6,486,803 B1 | 11/2002 | Luby et al. | |
| 6,567,948 B2 | 5/2003 | Steele et al. | |
| 6,570,843 B1 | 5/2003 | Wolfgang | |
| 6,574,213 B1 | 6/2003 | Anandakumar et al. | |
| 6,594,798 B1 | 7/2003 | Chou et al. | |
| 7,024,609 B2 | 4/2006 | Wolfgang et al. | |
| 7,418,651 B2 * | 8/2008 | Luby | H03M 13/29 714/800 |
| 7,516,387 B2 | 4/2009 | Arnold et al. | |
| 7,533,324 B2 * | 5/2009 | Fischer | H03M 13/09 714/776 |
| 7,739,580 B1 | 6/2010 | Fang et al. | |
| 8,245,096 B2 | 8/2012 | Fischer et al. | |
| 8,402,350 B2 | 3/2013 | Fang et al. | |
| 8,418,034 B2 | 4/2013 | Fang | |
| 8,595,606 B1 * | 11/2013 | Feng | H03M 13/2909 714/800 |
| 8,726,136 B2 | 5/2014 | Fang | |
| 8,959,418 B1 * | 2/2015 | Pfister | H03M 13/2948 714/746 |
| 9,071,274 B2 | 6/2015 | Fang | |
| 2002/0162072 A1 * | 10/2002 | Thesling, III | H03M 13/2742 714/777 |
| 2009/0193314 A1 * | 7/2009 | Melliar-Smith | H03M 13/2921 714/755 |

OTHER PUBLICATIONS

MacKay, David J.C., "Information Theory, Inference, and Learning Algorithms," Cambridge University Press, 2003.

McAuley, Anthony J, "Reliable Broadband Communication Using a Burst Erasure Correcting Code," SIGCOMM '90 Symposium, Sep. 1990, p. 297-306, 12 pages.

Miller, C Kenneth, "Reliable Multicast Protocols: A Practical View", Local Computer Networks Conference Proceedings, Nov. 1997, p. 369-378.

* cited by examiner

SYSTEM FOR HIGHLY RELIABLE FILE DELIVERY OF USING CONTINUOUS FEC ENCODING/DECODING

CROSS REFERENCE TO RELATED APPLICATIONS

This application claims priority to, and the benefit of, U.S. Provisional Patent Application Ser. No. 62/640,801, filed Mar. 9, 2018, which is hereby incorporated by reference in its entirety.

BACKGROUND OF THE DISCLOSURE

Field of the Disclosure

The present disclosure relates to data coding and decoding and, more particularly, to systems and methods for forward error correction (FEC) coding and decoding to enable reliable delivery of digital files (e.g., data files) to a remote site.

Description of the Related Art

Today, there are large digital data (e.g., audio, still image and video) that may be transferred from a host device, such as a host computer, to a potentially large number of subscriber devices, such as mobile telephones, and computer devices.

One technique for transferring data is to broadcast it using one-way broadcasting systems (or more generally, one-way transmission systems) such as satellite broadcast systems. However, one notable drawback of information distribution using one-way satellite broadcast systems compared to some other methods of information distribution, such as computer networks, is the inability of the subscriber devices to inform the host device that a reception error has occurred. Thus, it is essential in the case of one-way broadcasting systems that the data be transferred in such a way that all of the subscriber devices can recover from reception errors, e.g., by recovering the original transferred data.

The above drawback of one-way broadcasting (e.g., satellite broadcasting) is further compounded by the greater vulnerability of the broadcast signal to various forms of noise interference present in the transmission channel. One form of noise that is always present in the communication channel is "white" noise. For example, white noise is introduced in the channel by the thermal radiation of the gaseous constituents of the earth's surface. The strength and frequency of this noise varies, and it sometimes overpowers the transmitted signal causing it to be received erroneously. Because of white noise, a transmitted binary "zero" bit is occasionally received erroneously as a binary "one" bit, and vice-versa. Such errors are known as bit errors. White noise generally tends to cause isolated bit errors in a transmitted message. Although these bit errors are usually spread out throughout the message, they can be easily detected and corrected, because they are isolated.

In contrast with white noise, "impulse" noise tends to wipe out long sequences of consecutive bits. Such errors are known as "burst" errors. Their duration varies from a few milliseconds to a few seconds, but certain phenomena, such as rainstorms or sunspots, can cause burst errors of even longer duration, such as a few minutes. Unlike bit errors due to white noise, burst errors are not distributed over the entire message, but only a portion thereof. However, burst errors are more difficult to detect and correct, because they wipe out so many consecutive bits of data.

Known error detection and correction (EDAC) schemes are used to reduce the effects of errors caused by white noise. Known EDAC schemes generally operate at the bit level by adding enough redundant data bits to the data to detect and correct the received data. In practice, EDAC schemes can only detect and correct a limited amount of bit errors. The redundant data added to the original data, however, obviously increases the amount of data to be transmitted, and thus the transmission bandwidth and the transmission time. Well-known EDAC schemes include Hamming, Viturbi, Reed-Solomon, and other forward error correction (FEC) coding schemes.

In most broadcast systems, the transmitted data bits or symbols are most likely to be organized into large groups called packets, and a large data file is transmitted as a sequence of packets. The addressed subscriber devices reconstruct the large data file from the received packets. The previously-described noise bursts can typically damage one or more long sequences of consecutive packets. Those damaged packets are either not received by one or more of the subscriber devices or are received severely corrupted. Although bit-level EDAC schemes might be able to correct some of the corrupted packets, depending on the number of erroneous bits in the corrupted packets, these bit-level EDAC schemes are simply not robust enough to correct the great majority of the corrupted packets, e.g., in extended periods of burst noise. In extended periods of burst noise, a large amount of both the original data bits and the redundant EDAC bits in a packet are received corrupted, thus making bit-level error correction, and thus packet-level error-correction, impossible. Moreover, known EDAC schemes are useless in the case the transmitted packets are not received.

One known method for reducing the effect of burst errors in the above-described broadcast systems is retransmission of those packets that were not received or were received corrupted and could not be corrected (hereinafter those packets are simply referred to as "lost"). For example, a host device may broadcast via satellite to two geographically widely-separated subscriber devices A and B. Due to this wide separation, subscriber device A and subscriber device B may experience different weather conditions, and thus different patterns of noise. For example, subscriber device A may lose 20% of the transmitted packets, while subscriber computer B may successfully receive all the transmitted packets. Although it is possible to rebroadcast an entire file of data to all the subscriber devices, current methods of doing this are costly, waste time and bandwidth, and prevent communications channels from being used for other purposes. In the above example, subscriber device A would identify the lost packets (by examining the serial numbers of the correctly received packets) and would ask the host device to retransmit the packets it missed until the entire large data file could be reconstructed perfectly by subscriber computer A. In the satellite broadcast example given above, the request for missed packet retransmission is made through a back channel, and the host device rebroadcasts those missed packets via the satellite. Alternatively, the host device retransmits those missed packets only to subscriber device A through the back channel.

Retransmission of lost packets requires, however, (1) two-way communication back channels from all of the subscriber devices to the host device so each subscriber computer can inform the host device of which packets were lost, and (2) a retransmission protocol between the host device and the subscriber devices. Each back channel usually takes the form of a modem and telephone lines, or is part of a standard computer network. The back channel therefore has a limited bandwidth and can timely transmit only a limited amount of information. Back channels are also expensive. Further, retransmission increases the time required to distribute the data, and prevents the host device and subscriber devices from doing other tasks. In some applications, such as a mobile receiver, use of back channels may simply be impossible.

The ability to communicate reliably is fundamental to any communications scheme. Therefore, a need exists to provide a method and a system for correction coding and decoding that overcomes the disadvantages noted above. There is also a need for a scheme for generating from a finite set of data an unbounded number of packets for transmission to a receiver, out of which any sufficiently large subset of those packets is sufficient to reconstruct an original source file.

BRIEF SUMMARY OF THE DISCLOSURE

The example embodiments described herein meet the above-identified needs by providing systems, methods, apparatus and computer program products for performing correction coding and decoding on source data packets to achieve reliable file delivery of a source file to be transmitted to a receiver, using a combination of a carefully designed encoding sequence of a "braided" FEC coding and low density parity-check FEC (LDPC FEC) coding, which uses carefully designed polynomials. The "braided" FEC coding involves performing encoding on rows, columns and diagonals of a source packet matrix. Furthermore, for decoding, an iteration between braided FEC decoding and LDPC FEC decoding is utilized.

In one example embodiment of the present disclosure, braided FEC packets are generated for each column, row and diagonal of a respective group by XOR'ing the source packets from the corresponding column, row and diagonal. Then, LDPC FEC packets are generated for the respective group of source packets and corresponding braided FEC packets. The process of generating LDPC FEC packets for each group of source packets and corresponding Braided FEC packets continues until terminated. The FEC packets generated in this manner are referred to as the continuous FEC packets.

In one example embodiment of the present disclosure, a computer-implemented method for at least encoding a source file to be transmitted to a receiver is provided. The method includes: dividing the source file into a plurality of groups of source packets, each group comprised of a plurality of source packets; for each respective group of source packets, arranging the source packets into a matrix format; for each respective group of source packets in the matrix format, generating braided forward error correction (braided FEC) packets; selecting a polynomial and a pseudorandom generator, wherein coefficients of the polynomial are non-negative and the sum of all coefficients of the polynomial is one; generating, using a randomly selected number selected according to the coefficients of the polynomial, a low density parity-check forward error correction (LDPC FEC) packet for the respective group of source packets and the corresponding braided FEC packets generated for the respective group; generating a continuous FEC packet by adding corresponding header information to the LDPC FEC packet, wherein the header information comprises information regarding the components of the LDPC FEC packet from at least one of the source packets of the respective group and the braided FEC packets for the respective group; and repeating the steps of generating the LDPC FEC packet and the continuous FEC packet for at least one additional group of source packets in the matrix format.

In another example embodiment of the present disclosure, the continuous FEC packets are transmitted to a receiver component and, upon reception, an iteration of LDPC decoding and braided FEC decoding are applied to the received continuous FEC packets. The LDPC decoding and the braided FEC decoding will continue until all the source packets are recovered and the file is constructed or until there is no more incoming packets.

In another example embodiment of the present disclosure, a computer-implemented method for reconstructing the source file from the continuous FEC packets is provided. The method includes: receiving, by a receiver, the at least one of the continuous FEC packets; and reconstructing, by the receiver, the source file based on the received continuous FEC packet. The reconstructing includes: (a) at least one of (i) performing an LDPC FEC decoding process on the at least one received continuous FEC packet, and (ii) performing a braided FEC decoding process on the at least one received continuous FEC packet; and (b) repeating at least one of steps (a)(i) and (a)(ii) in the case ether step recovers one of a source packet or a braided FEC packet.

In another example embodiment of the present disclosure, a system for at least encoding a source file to be transmitted to a receiver is provided. The system includes: a packetizer configured to (a) divide the source file into a plurality of groups of source packets, each group comprised of a plurality of source packets, and (b) for each respective group of source packets, arrange the source packets into a matrix format; and an encoder configured to (c) for each respective group of source packets in the matrix format, generate braided forward error correction (FEC) packets, (d) select a polynomial and a pseudorandom generator, wherein coefficients of the polynomial are non-negative and the sum of all coefficients of the polynomial is one, (e) generate, using a randomly selected number selected according to the coefficients of the polynomial, a low density parity-check forward error correction (LDPC FEC) packet for the respective group of source packets and the corresponding braided FEC packets generated for the respective group, (f) generate a continuous FEC packet by adding corresponding header information to the LDPC FEC packet, wherein the header information comprises information regarding the components of the LDPC FEC packet from at least one of the source packets of the respective group and the corresponding braided FEC packets generated for the respective group, and (g) repeat the steps of generating the LDPC FEC packet and the continuous FEC packet for at least one additional group of source packets in the matrix format.

In another example embodiment of the present disclosure, a system for reconstructing the source file from the continuous FEC packets is provided. The system includes a receiver configured to: receive the at least one of the continuous FEC packets; and reconstruct the source file based on the received continuous FEC packet. The reconstructing includes (a) at least one of (i) performing an LDPC FEC decoding process on the at least one received continuous FEC packet, and (ii) performing a braided FEC decoding process on the at least one received continuous FEC packet; and (b) repeating at least one of steps (a)(i) and (a)(ii) in the case ether step recovers one of a source packet or a braided FEC packet.

In another example embodiment of the present disclosure, a non-transitory, computer-readable medium storing a program is provided, the program having program codes which, when executed by a computer, perform a method for at least encoding a source file to be transmitted to a receiver. The method includes: dividing the source file into a plurality of groups of source packets, each group comprised of a plurality of source packets; for each respective group of source packets, arranging the source packets into a matrix format; for each respective group of source packets in the matrix format, generating braided forward error correction (FEC) packets; selecting a polynomial and a pseudorandom generator, wherein coefficients of the polynomial are nonnegative and the sum of all coefficients of the polynomial is one; generating, using a randomly selected number selected according to the coefficients of the polynomial, a low density parity-check forward error correction (LDPC FEC) packet for the respective group of source packets and the corresponding braided FEC packets generated for the respective group; generating a continuous FEC packet by adding corresponding header information to the LDPC FEC packet, wherein the header information comprises information regarding the components of the LDPC FEC packet from at least one of the source packets of the respective group and the braided FEC packets for the respective group; and repeating the steps of generating the LDPC FEC packet and the continuous FEC packet for at least one additional group of source packets in the matrix format.

In another example embodiment of the present disclosure, a non-transitory, computer-readable medium storing a program is provided, the program having program codes which, when executed by a computer, perform a method for reconstructing the source file from the continuous FEC packets is provided. The method includes: receiving, by a receiver, the at least one of the continuous FEC packets; and reconstructing, by the receiver, the source file based on the received continuous FEC packet. The reconstructing includes: (a) at least one of (i) performing an LDPC FEC decoding process on the at least one received continuous FEC packet, and (ii) performing a braided FEC decoding process on the at least one received continuous FEC packet; and (b) repeating at least one of steps (a)(i) and (a)(ii) in the case ether step recovers one of a source packet or a braided FEC packet.

BRIEF DESCRIPTION OF THE DRAWINGS

The various aspects of the present disclosure can be best understood by reference to the detailed description of the preferred embodiments set forth below taken with the drawings, in which:

FIGS. 4-7 depict an exemplary procedure for encoding data using braided FEC in accordance with an embodiment of the present disclosure.

DETAILED DESCRIPTION

An exemplary embodiment of the present disclosure is described in detail herein with reference to an exemplary transmitter component for encoding a file into a sequence of packets and transmitting the encoded packets, and an exemplary receiver component for receiving and decoding the transmitted packets, or a subset thereof, to recover the original file in a one-way broadcast system environment. This example embodiment is not intended to be limiting, and the present disclosure is intended to encompass alternative embodiments, which will be readily apparent to one skilled in the relevant art(s) reading the present disclosure. For example, the present disclosure encompasses not only a method and a system for correction coding and decoding of digital files in a one-way transmission environment, but the present disclosure also encompasses a method and a system for correction coding and decoding of digital files in a bi-directional transmission environment.

Figure 1:
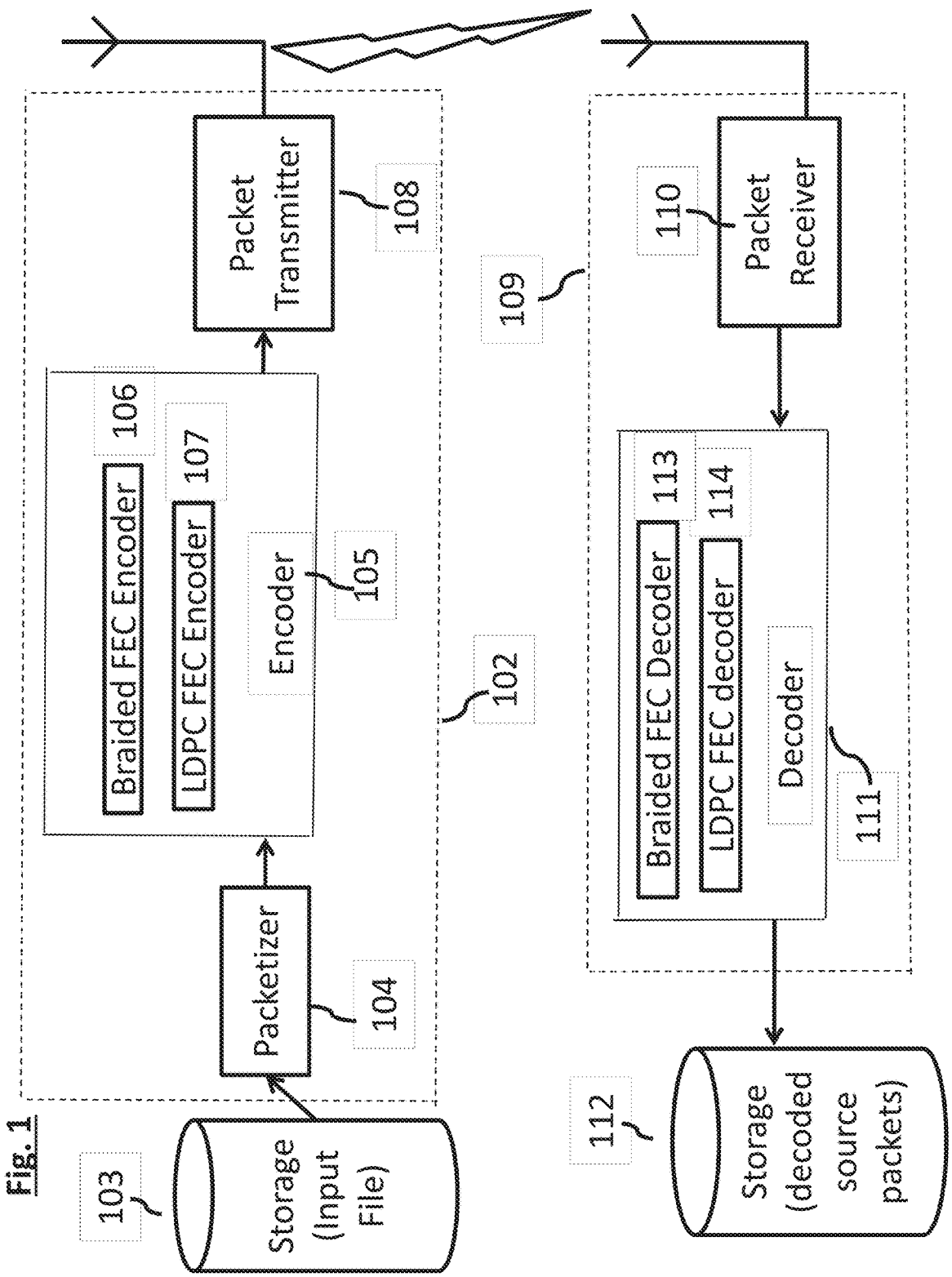
FIG. 1 depicts an exemplary embodiment of a communication scheme in accordance with the present disclosure.

FIG. 1 depicts a block diagram illustrating an exemplary communication scheme between a transmitter component 102 and a receiver component 109 in accordance with the present disclosure. In the example embodiment shown in FIG. 1, the transmitter component 102 includes, e.g., a packetizer 104, an encoder 105 (which in turn includes a braided FEC encoder 106 and an LDPC FEC encoder 107), and a packet transmitter. The packetizer 104 of the transmitter component receives data, e.g., an input file, from a storage (memory) 103, and the packetizer 104 packetizes the input file. Although the storage 103 is shown in this example embodiment as a separate component from the transmitter component 102, the storage 103 can be incorporated as a part of the transmitter component 102. The packetizer 104 performs the following: a) divides the input file into a plurality packets; and b) forms one or more groups of packets (hereinafter also referred to as a "group"), each group of packets including multiple packets and being arranged into a matrix format. For each respective group of packets, the braided FEC Encoder 106 generates braided FEC packets, e.g., using a technique which is described in detail below. An LDPC FEC Encoder 107 generates LDPC FEC packets (e.g., using a technique which is described in detail below) for the respective group of input packets and the corresponding braided FEC packets. The LDPC FEC packets generated in this manner are called continuous FEC packets. As will be described in more detail below, the encoder 105 of the transmitter component 102 generates continuous FEC packets for all the groups of packets in the input file, which continuous FEC packets are transmitted by the packet transmitter 108 to the receiver component 109. In this manner, the source (i.e., original) data of the input file are encoded as continuous FEC packets and transmitted to a receiver component 109.

The receiver component 109 reconstructs the source file based on the received continuous FEC packets. In the example embodiment shown in FIG. 1, the receiver component 109 includes, e.g., a packet receiver 110, and a decoder 111 (which in turn includes a braided FEC decoder 113 and an LDPC FEC decoder 114). The packet receiver 110 receives the continuous FEC packets, and the decoder 111 performs an iteration of braided FEC decoding and LDPC FEC decoding operations on the received packets to reconstruct the original input file, and stores the decoded source packets into a storage unit (memory) 112. Although the storage unit 112 is shown in this example embodiment as a separate component from the receiver component 109, the storage unit 112 can be incorporated as a part of the receiver component 109.

Figure 2:
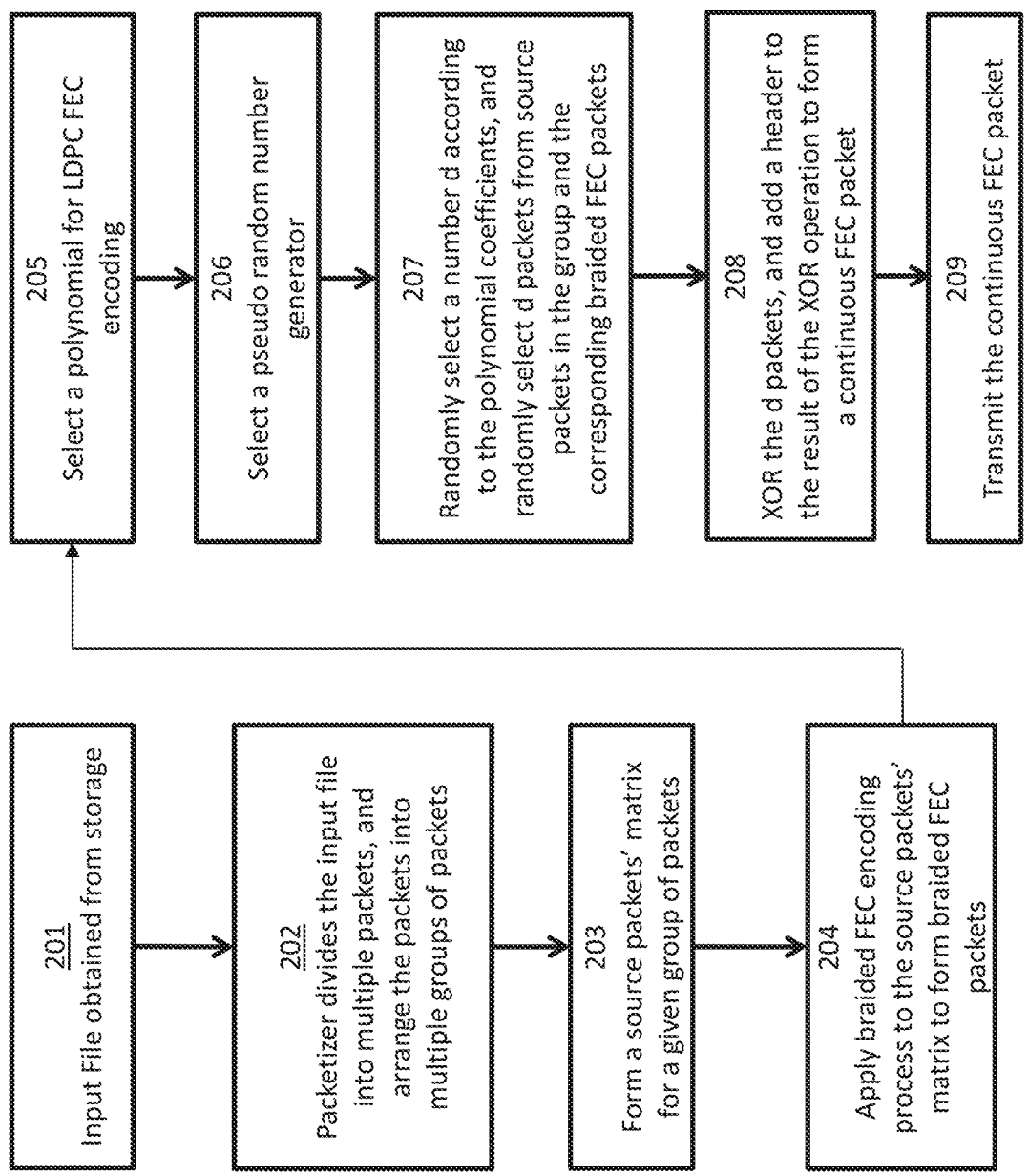
FIG. 2 depicts a flowchart illustrating a process executed by the transmitter component of a communication scheme, according to one embodiment of the present disclosure.

FIG. 2 depicts a flowchart illustrating an example process 200 executed by the transmitter component 102 discussed above with reference to FIG. 1, according to one embodiment of the present disclosure. In block 201, the input file is obtained from the storage 103. In block 202, packetizer 104 processes the input file into packets, e.g., the packetizer 104 divides the input file of finite length into multiple packets each having the same number of bytes, except for the last packet that can have fewer bytes than the other packets. If the last packet has fewer bytes than the other packets, then stuff bytes (e.g., consisting 0's) can be added to the last packet to increase the size such that the last packet has the same number of bytes as the other packets.

The resulting packets are further arranged into groups of packets where different groups may have different number of packets. Stuff packets (e.g., consisting of all 0's) also can be added to a group to increase its packet count.

In block 203, each group of packets is arranged into a matrix. The example described below references a single group, but other groups are treated the same way. Given a group that has (R*S) packets, R and S being some positive integers, these packets are arranged into an R by S matrix (R rows and S columns). These (R*S) packets are called source packets. Each of the source packets is given a coordinate associated with it. For example, the coordinate (i, j) indicates the source packet in the $i^{th}$ row and $j^{th}$ column, where $1<=i<=R$, $1<=j<=S$. In addition, for an integer x and a positive integer y, a unique integer z is defined as z=x % y, z being between 1 and y such that (x-z) is a multiple of y. If a number u is set between 1 and R, then the following S source packets form a row, (u, v), where v is running from 1 to S. When u changes from 1 to R, then these yield R rows of source packets. If a number v is set between 1 and S, then the following R source packets form a column, (u, v), where u is running from 1 to R. When v changes from 1 to S, this yields S columns of source packets. If a number v is set between 1 and S, then the following R source packets form a diagonal, (u, (u+v) % S), where u is running from 1 to R. When v changes from 1 to S, this yields S diagonals of the source packets.

In block 204 of FIG. 2, a braided FEC encoding process is applied to this group of source packets arranged into a matrix. For each column of the matrix, the FEC encoding generates one FEC packet by XOR'ing of all the source packets in the respective column. For each row of the matrix, the FEC encoding generates one FEC packet by XOR'ing of all the source packets in the respective row. For each diagonal of the matrix, the FEC encoding generates one FEC packet by XOR'ing of all the source packets in that diagonal. These generated XOR packets are called the braided FEC packets for the respective group of source packets.

FIGS. 4-7 depict a simplified exemplary procedure for encoding data using braided FEC in accordance with an embodiment of the present disclosure. In this example, given a file with 12 (4×3) packets, a 4×3 source packets (p) matrix is created by placing the first packet in the file into matrix position (1, 1), placing the second packet into position (1, 2), and so on until the 3rd packet in the file is placed into position (1, 3). Then, the 4th packet is placed into position (2, 1), and so on until the 6th packet is placed into position (2, 3). This procedure continues until all 12 source packets in the file are placed into the matrix. The result will be a 4 by 3 source packets matrix as shown in FIG. 4.

Referring to FIG. 5, one XOR FEC packet (n) for each column's 4 source packets (i.e., the vertical boxes) are generated. Next, with reference to FIG. 6, one XOR FEC packet (x) for each row's 3 source packets (i.e., the horizontal boxes) is calculated. One XOR FEC packet (d) for each diagonal's 4 source packets are then calculated as shown in FIG. 7 (i.e., the $p_s$ with the same subscript form a diagonal, and d with the same subscript is the corresponding XOR FEC packet).

Returning to the example flowchart of FIG. 2, let's assume the count of source packets in a group is the number NS and the count of the generated braided FEC packets for that group is the number NB. For these (NS+NB) number of source packets in a group and the corresponding braided FEC packets generated, an LDPC FEC encoding process is applied to generate LDPC FEC packets. In block 205 of FIG. 2, a polynomial satisfying the following conditions is selected for LDPC FEC encoding:

(1) it is a finite degree polynomial of a variable x;
(2) its constant term is 0;
(3) the coefficients are non-negative;
(4) the sum of all the coefficients is 1;
(5) the coefficient of the term x is positive; and
(6) the set of degrees of terms with positive coefficients is denoted by E.

The coefficient of degree d term $x^d$ in this polynomial is interpreted as the probability of selecting the number d among numbers in the set E. In block 206 of FIG. 2, a pseudo random number generator is chosen. For example, the rand( ) function defined in C standard library can be used. In block 207 of FIG. 2, a number in set E is randomly selected according to the coefficients (interpreted as probabilities for correspond degree number in the set E), e.g., let's assume the number selected is d. Then, d packets are randomly and uniformly selected from the (NS+NB) number of packets (source packets in the group and the corresponding braided FEC packets generated). In block 208, these d packets are XOR'ed using C/C++ XOR operation to form a resulting packet. A header is added to the resulting packet from the XOR operation, which header has the information about the d packets that are used to form the resulting packet. The packet formed by adding the header to the resulting packet of the XOR operation is called a continuous FEC packet. In block 209, the generated continuous FEC packet for the group is transmitted. The transmitting of continuous FEC packets from different groups can be interleaved in a round robin manner.

An example of the continuous FEC encoding process is provided below. Let's assume the input file has a size of 20,200,990 bytes. If each packet has 1,000 bytes, then 20,201 packets are provided, the last packet having only 990 bytes. To make the last packet size to be 1,000 bytes, 10 stuff bytes, e.g., Os, are added to this last packet. These 20,201 packets, which are called source packets, are divided into 2 groups. The first group has the first 10,000 packets, and the second group has the remaining 10,201 packets. The source packets in the first group are arranged into a 100 by 100 matrix. The source packets in the second group are arranged into a 101 by 101 matrix. For the first source packets matrix, one XOR packet is generated for each row, column and diagonal. These 300 XOR packets generated are the braided FEC packets for the first group. For the second source packets matrix, one XOR packet is generated for each row, column and diagonal. These 303 XOR packets generated are the braided FEC packets for the second group.

Next, a polynomial for LDPC FEC encoding is chosen, an example of which polynomial is:

$$F(x)=0.01x+0.49x^2+0.16x^3+0.08x^4+0.05x^5+0.03x^6+0.02x^7+0.01x^8+0.15x^{65}$$

The sum of the coefficients for this polynomial is 1. The set E consisting of degree numbers in this polynomial is {1, 2, 3, 4, 5, 6, 7, 8, 65}, and their corresponding probabilities are {0.01, 0.49, 0.16, 0.08, 0.05, 0.03, 0.02, 0.01, 0.15}.

For the first group which has 10,000 source packets and corresponding 300 braided FEC packets, a continuous FEC packet is generated as follows. First, a number is randomly selected from the set E {1, 2, 3, 4, 5, 6, 7, 8, 65} according to their corresponding probabilities {0.01, 0.49, 0.16, 0.08, 0.05, 0.03, 0.02, 0.01, 0.15} defined as the corresponding coefficients, e.g., let's assume the randomly selected number is 3. Then, 3 packets are randomly and uniformly selected from the first group which has 10,000 source packets and corresponding 300 braided FEC packets, (e.g., these 3 packets could be the $996^{th}$ source packet, the $7837^{th}$ source packet and the $201^{st}$ braided FEC packet) and these selected 3 packets are XOR'ed to generate one resulting LDPC FEC packet. A header information is added to the resulting packet of the XOR operation to form a continuous FEC packet. The above procedure is repeated to generate other continuous FEC packets for this group.

The packets generated by one transmitter component 102 can be received by multiple receiver components (e.g., receiver component 109). In some applications, the receiver component 109 will receive the packets in a one-way manner, i.e., the receiver component 109 will have no opportunity to send information back to the transmitter component 102. In these applications, there can be no way to guarantee that the receiver component 109 will receive sufficient information to decode the transmission. Typically, the transmitter component 102 will be configured to generate and transmit sufficient continuous FEC packets for each group of source packets so that the population of receiver components 109 should have a reasonable probability of receiving enough data to decode the transmission file, given any available information about the times that the receiver components 109 will be running and the expected packet losses during the transmission.

Transmitter component 102 can be configured to encode a certain number of continuous FEC packets for each group (e.g., 370,000), or to run for a certain period of time (e.g., five hours), or to run until stopped by some external process or input. The transmitter component 102 can also be configured to stop and start again at another time. It should be understood that other criteria for ending the encoding processing exist and are within the scope of the present disclosure.

In some applications, the receiver component 109 can have a mechanism to report successful decoding back to the transmitter component 102. In these applications, the transmitter component 102 can stop processing when it has received a successful decoding report from each receiver component 109.

Figure 3:
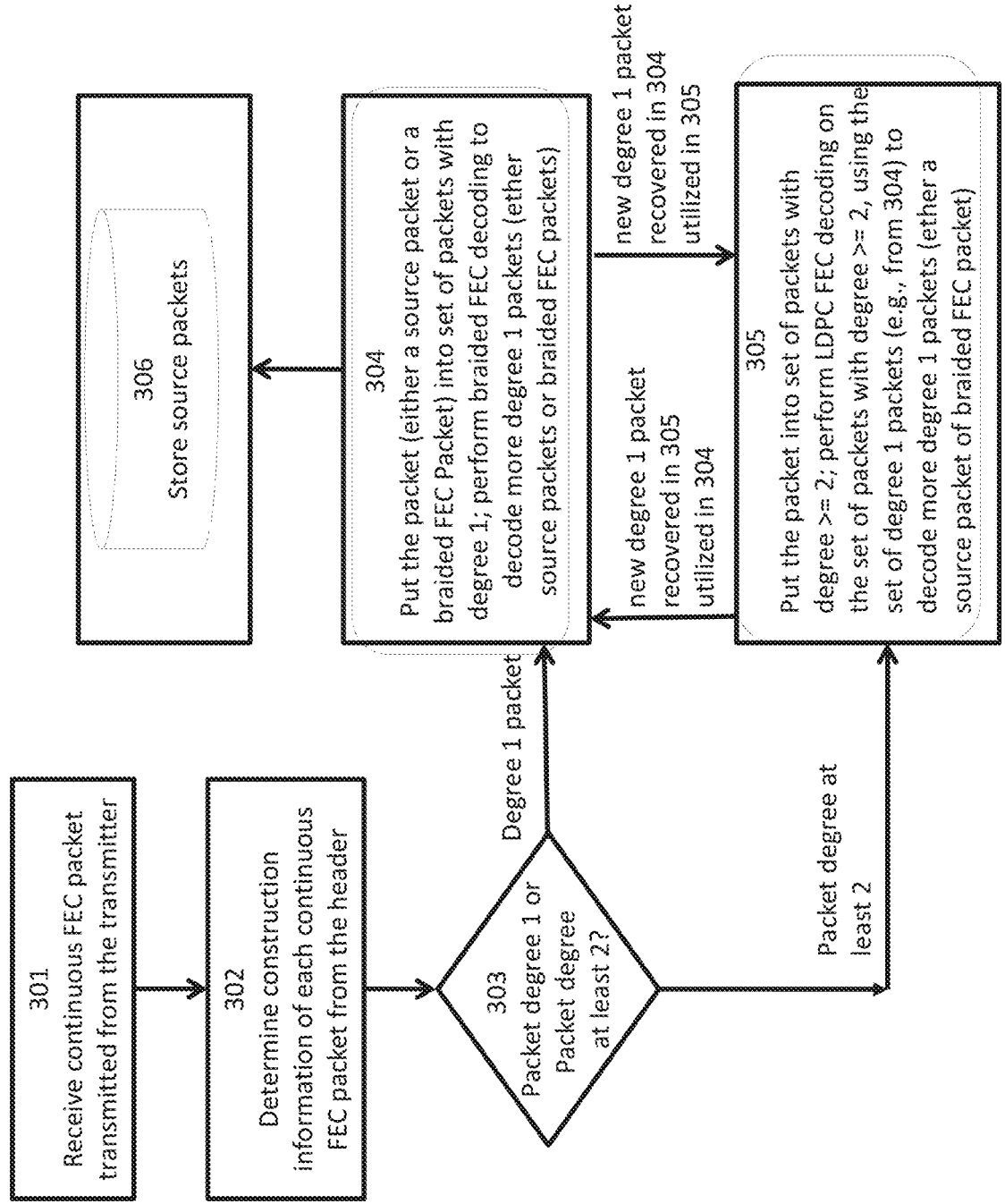
FIG. 3 depicts a flowchart illustrating a process executed by the receiver component of a communication scheme, according to one embodiment of the present disclosure.

FIG. 3 depicts a flowchart illustrating a decoding process executed by the receiver component 109 previously discussed with reference to FIG. 1. Generally, packet receiver 110 of the receiver component 109 may receive only a small subset of the continuous FEC packets transmitted by transmitter component 102. For example, the receiver component 109 may be started long after the transmitter component 102 has started transmitting, or the receiver component 109 may be turned on and off many times before receiving enough packets to reconstruct the source file. Packets may also be lost in transmission when the receiver is operating. After enough continuous FEC packets for each group have been collected, the receiver component 109 reconstructs the source file from the collection of received continuous FEC packets. The construction process is based on an iteration of LDPC FEC decoding and braided FEC decoding, as described in detail below.

In block 301 of FIG. 3, the continuous FEC packet transmitted from the transmitter component 102 is received by the receiver component 109. In block 302, the received continuous FEC packet's construction information at transmitter side is determined from the header information of the received continuous FEC packet. As described above, the header includes information regarding which group of source packets and braided FEC packets this continuous FEC packet is for, and the components that this continuous FEC packet is made of. More specifically, from the header information of each respective continuous FEC packet, the components of the respective continuous FEC packet which indicate its XOR'ing components of source packets and braided FEC packets can be determined (e.g., by the decoder 111 of FIG. 1). The number of components for the respective continuous FEC packet is called the "degree" of the respective continuous FEC packet. In block 303, it is determined (e.g., by the decoder 111 of FIG. 1) whether the incoming packet's degree is 1 or at least 2 (greater than or equal to 2). If the received packet's degree is 1, as shown in block 304 of FIG. 3, it is ether a source packet or a braided FEC packet, and the received packet will be put into a set of recovered source packets and braided FEC packets. In block 304, the braided FEC decoder (e.g., 113 of FIG. 1) will try to decode additional source packets and/or braided FEC packets by braided FEC decoding algorithm, which is described below in detail.

Let's say, for example, $A_1, A_2, \ldots, A_{100}$ is a row of 100 source packets, and the braided FEC packet corresponding to this row is $B = A_1 \hat{} A_2 \hat{} \ldots \hat{} A_{100}$ (where $\hat{}$ is the XOR operation). If the receiver receives or decoded packets $A_2, A_3, \ldots, A_{100}$ and B, except the source packet $A_1$, which is not received or decoded yet, then the decoder 111 of the receiver component performs a braided FEC decoding to recover packet $A_1$ by:

$$A_1 = B \hat{} A_2 \hat{} A_3 \hat{} \ldots \hat{} A_{100}$$

The degree 1 packet $A_1$ is recovered and is put into the set of degree 1 packets (as shown in block 304), and since $A_1$ is a source packet, it is also stored into the storage (as shown in block 306). In addition, as shown in FIG. 3, if new degree 1 packet is recovered in block 304, the recovered degree 1 packet is utilized in block 305's LDPC FEC decoding to decode more degree 1 packets, as described in detail below.

For a received continuous FEC packet having a degree equal to or greater than 2, an LDPC FEC decoding process is applied, as shown in block 305, using the decoded or received degree 1 packets set. The LDPC FEC decoding is performed as follows. Let's say, for example, we have an LDPC FEC packet P1^P2^P3 (this is a degree 3 packet, where P1, P2, and P3 are three packets from a group of source packets and its associated braided FEC packets, and ^ stands for XOR operation), and also P2 is already recovered (e.g., received or recovered by previous decoding process in block 304 or block 305), then the degree 3 packet P1^P2^P3 can be decoded to degree 2 packet P1^P3 by ((P1^P2^P3)^P2). Furthermore, if P1 is recovered (e.g., received or recovered by previous decoding process in block 304 or block 305), then the degree 2 packet P1^P3 can be decoded to degree 1 packet P3 by ((P1^P3)^P1). The degree 1 packet P3 is ether a source packet or a braided FEC packet. As shown in FIG. 3, if new degree 1 packet is recovered in block 305, the recovered degree 1 packet is utilized in block 304's braided FEC decoding to decode more degree 1 packets.

For each incoming continuous FEC packet, the sequence of braided FEC decoding and LDPC FEC decoding may go to several iterations, and several source packets or braided FEC packets can be recovered until ether the decoding process cannot recover more source packets or braided FEC packets.

For each source packet received or decoded (e.g., as described above in connection with blocks 303-305 FIG. 3), the source packet will be stored, as shown in block 306 of FIG. 3, into decoded file storage. This process will continue until the full original file is recovered, or until there is no more incoming continuous FEC packet which may result in an incomplete file.

In this document, the term "computer-readable medium" generally refers to media such as removable storage drive, a hard disk installed in hard disk drive, and the like, which media serve as storage for computer programs that can be provided to, and executed by, computer systems. Computer programs may also be received via a communications interface. Computer programs, when executed, enable the computer system to perform the features of the present invention, as discussed herein. In particular, the computer programs, when executed, enable a processor to perform the features of the example embodiments of the present disclosure.

The example embodiments according to the present disclosure can be implemented primarily in hardware using, for example, hardware components such as application specific integrated circuits (ASICs). Implementation of the hardware state machine so as to perform the functions described herein will be apparent to persons skilled in the relevant art(s). Alternatively, the example embodiments according to the present disclosure can be implemented using a combination of both hardware and software.

While various example embodiments of the present disclosure have been described above, the example embodiments are merely exemplary and should not be interpreted as limiting. It will be apparent to persons skilled in the relevant art(s) that various changes in form and detail can be made therein, and these variations are fully encompassed by the present disclosure.

What is claimed is:

1. A computer-implemented method for at least encoding a source file to be transmitted to a receiver and subsequently reconstructing the encoded source file, comprising the steps of:
    dividing the source file into a plurality of groups of source packets, each group comprised of a plurality of source packets;
    for each respective group of source packets, arranging the source packets into a matrix format;
    for each respective group of source packets in the matrix format, generating braided forward error correction (FEC) packets;
    selecting a polynomial and a pseudorandom generator, wherein coefficients of the polynomial are non-negative and the sum of all coefficients of the polynomial is one;
    generating, using a randomly selected number selected according to the coefficients of the polynomial, a low density parity-check forward error correction (LDPC FEC) packet for the respective group of source packets and the corresponding braided FEC packets generated for the respective group;
    generating a continuous FEC packet by adding corresponding header information to the LDPC FEC packet, wherein the header information comprises information regarding the components of the LDPC FEC packet from at least one of the source packets of the respective group and the braided FEC packets for the respective group;
    repeating the steps of generating the LDPC FEC packet and the continuous FEC packet for at least one additional group of source packets in the matrix format;
    receiving, by the receiver, the at least one of the continuous FEC packets; and
    reconstructing, by the receiver, the source file based on the received continuous FEC packet, the reconstructing comprising:
        (a) at least one of:
            (i) performing an LDPC FEC decoding process on the at least one received continuous FEC packet; and
            (ii) performing a braided FEC decoding process on the at least one received continuous FEC packet; and
        (b) repeating at least one of steps (a)(i) and (a)(ii) in the case either step recovers one of a source packet or a braided FEC packet.

2. The method according to claim 1, wherein for two or more groups of source packets processed in the steps of generating the LDPC FEC packet and the continuous FEC packet, the two or more groups are processed in a round-robin fashion.

3. The method of claim 1, further comprising:
    storing at least a recovered source packet into a storage.

4. The method of claim 1, wherein the source file comprises a plurality of independent groups of source packets, the method further comprising:
    performing on each continuous FEC packet for a respective independent group of source packets an iteration of braided FEC decoding and LDPC FEC decoding.

5. A system for at least encoding a source file to be transmitted to a receiver and subsequently reconstructing the encoded source file, comprising:
    a packetizer configured to:
        divide the source file into a plurality of groups of source packets, each group comprised of a plurality of source packets; and
        for each respective group of source packets, arrange the source packets into a matrix format; and
    an encoder configured to:
        for each respective group of source packets in the matrix format, generate braided forward error correction (FEC) packets;
        select a polynomial and a pseudorandom generator, wherein coefficients of the polynomial are non-negative and the sum of all coefficients of the polynomial is one;
        generate, using a randomly selected number selected according to the coefficients of the polynomial, a low density parity-check forward error correction (LDPC FEC) packet for the respective group of source packets and the corresponding braided FEC packets generated for the respective group;
        generate a continuous FEC packet by adding corresponding header information to the LDPC FEC packet, wherein the header information comprises information regarding the components of the LDPC FEC packet from at least one of the source packets of the respective group and the corresponding braided FEC packets generated for the respective group;
        repeat the steps of generating the LDPC FEC packet and the continuous FEC packet for at least one additional group of source packets in the matrix format; and
    the receiver configured to:
        receive the at least one of the continuous FEC packets; and
        reconstruct the source file based on the received continuous FEC packet, the reconstructing comprising:
            (a) at least one of:

(i) performing an LDPC FEC decoding process on the at least one received continuous FEC packet; and (ii) performing a braided FEC decoding process on the at least one received continuous FEC packet; and (b) repeating at least one of steps (a)(i) and (a)(ii) in the case ether step recovers one of a source packet or a braided FEC packet.

6. The system according to claim 5, wherein for two or more groups of source packets processed in the steps of generating the Braided FEC packet and the LDPC FEC packet and the continuous FEC packet, the two or more groups are processed in a round-robin fashion.

7. The system according to claim 5, wherein the receiver is configured to store at least a recovered source packet into a storage.

8. The system according to claim 5, wherein the source file comprises a plurality of independent groups of source packets, the system further comprising:

performing on each continuous FEC packet for a respective independent group of source packets an iteration of braided FEC decoding and LDPC FEC decoding.

9. A non-transitory, computer-readable medium storing a program having program codes which, when executed by a computer, perform a method for at least encoding a source file to be transmitted to a receiver and subsequently reconstructing the encoded source file, the method comprising the steps of:

dividing the source file into a plurality of groups of source packets, each group comprised of a plurality of source packets;

for each respective group of source packets, arranging the source packets into a matrix format;

for each respective group of source packets in the matrix format, generating braided forward error correction (FEC) packets;

selecting a polynomial and a pseudorandom generator, wherein coefficients of the polynomial are non-negative and the sum of all coefficients of the polynomial is one;

generating, using a randomly selected number selected according to the coefficients of the polynomial, a low density parity-check forward error correction (LDPC FEC) packet for the respective group of source packets and the corresponding braided FEC packets generated for the respective group;

generating a continuous FEC packet by adding corresponding header information to the LDPC FEC packet, wherein the header information comprises information regarding the components of the LDPC FEC packet from at least one of the source packets of the respective group and the braided FEC packets for the respective group;

repeating the steps of generating the LDPC FEC packet and the continuous FEC packet for at least one additional group of source packets in the matrix format;

receiving, by the receiver, the at least one of the continuous FEC packets; and reconstructing, by the receiver, the source file based on the received continuous FEC packet, the reconstructing comprising:

(a) at least one of:

(i) performing an LDPC FEC decoding process on the at least one received continuous FEC packet; and (ii) performing a braided FEC decoding process on the at least one received continuous FEC packet; and (b) repeating at least one of steps (a)(i) and (a)(ii) in the case either step recovers one of a source packet or a braided FEC packet.

10. The non-transitory, computer-readable medium according to claim 9, wherein for two or more groups of source packets processed in the steps of generating the LDPC FEC packet and the continuous FEC packet, the two or more groups are processed in a round-robin fashion.

11. The non-transitory, computer-readable medium according to claim 9, wherein the method further comprises:

storing at least a recovered source packet into a storage.

12. The non-transitory, computer-readable medium according to claim 9, wherein the source file comprises a plurality of independent groups of source packets, and wherein the method further comprises:

performing on each continuous FEC packet for a respective independent group of source packets an iteration of braided FEC decoding and LDPC FEC decoding.

* * * * *